(12) United States Patent
Moon et al.

(10) Patent No.: US 11,190,202 B2
(45) Date of Patent: Nov. 30, 2021

(54) ANALOG-TO-DIGITAL CONVERTER

(71) Applicant: SAMSUNG ELECTRONICS CO., LTD., Suwon-si (KR)

(72) Inventors: Kyoungjun Moon, Hwaseong-si (KR); Dongryeol Oh, Suwon-si (KR); Youngjae Cho, Hwaseong-si (KR); Michael Choi, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/000,665

(22) Filed: Aug. 24, 2020

(65) Prior Publication Data

US 2021/0226643 A1 Jul. 22, 2021

(30) Foreign Application Priority Data

Jan. 20, 2020 (KR) .................. 10-2020-0007273

(51) Int. Cl.
*H03M 1/10* (2006.01)
*H03M 1/14* (2006.01)
*G04F 10/00* (2006.01)
*H03M 1/38* (2006.01)

(52) U.S. Cl.
CPC ......... *H03M 1/1028* (2013.01); *H03M 1/145* (2013.01); *G04F 10/005* (2013.01); *H03M 1/38* (2013.01)

(58) Field of Classification Search
CPC ...... H03M 1/1028; H03M 1/145; H03M 1/38; H03M 1/40; H03M 1/403; H03M 1/406; H03M 1/42; H03M 1/44; H03M 1/50; H03M 1/60; H03M 1/164; G04F 10/005

USPC ................................. 341/156, 161–163, 166
See application file for complete search history.

(56) References Cited

U.S. PATENT DOCUMENTS

| | | |
|---|---|---|
| 6,686,864 B1 | 2/2004 | Moreland |
| 6,731,231 B2 | 5/2004 | Roovers et al. |
| 7,893,861 B2 | 2/2011 | Bulzacchelli et al. |
| 8,026,838 B2* | 9/2011 | Hales ............... H03M 1/146 341/155 |
| 8,269,660 B2 | 9/2012 | Veldhoven |
| 8,830,109 B1 | 9/2014 | Wong et al. |

(Continued)

OTHER PUBLICATIONS

Zhang, et al. "A 0.6-V 13-bit 20-MS/s Two-Step TDC-Assisted SAR ADC With PVT Tracking and Speed-Enhanced Techniques", IEEE Journal of Solid-State Circuits, vol. 54, No. 12, Dec. 2019, 14 pages.

(Continued)

*Primary Examiner* — Khai M Nguyen
(74) *Attorney, Agent, or Firm* — F. Chau & Associates, LLC

(57) ABSTRACT

An analog-to-digital converter includes: a voltage-current converter receiving an analog input voltage, generating a first digital signal from the analog input voltage, and outputting a residual current remaining after the first digital signal; a current-time converter converting the residual current into a current time in a time domain; and a time-digital converter receiving the residual time, and generating a second digital signal from the residual time, wherein the first digital signal and the second digital signal are sequences of digital codes representing respective signal levels of the analog input voltage.

20 Claims, 12 Drawing Sheets

(56) References Cited

U.S. PATENT DOCUMENTS

| | | |
|---|---|---|
| 9,407,277 B2 | 8/2016 | Huang |
| 9,483,028 B1 | 11/2016 | Kinyua |
| 9,673,835 B1 * | 6/2017 | Kinyua ................. H03M 1/145 |
| 10,461,761 B2 | 10/2019 | Kinyua |
| 2017/0001632 A1 | 6/2017 | Kinyua |

OTHER PUBLICATIONS

Moon, et al. "A 9.1-ENOB 6-mW 10-Bit 500-MS/s Pipelined-SAR ADC With Current-Mode Residue Processing in 28-nm CMOS", IEEE Journal of Solid-State Circuits, vol. 54, No. 9, Sep. 2019, 11 pages.

* cited by examiner

ANALOG-TO-DIGITAL CONVERTER

CROSS-REFERENCE TO RELATED APPLICATION(S)

This application claims priority under 35 U.S.C. § 119 to Korean Patent Application No. 10-2020-0007273 filed on Jan. 20, 2020 in the Korean Intellectual Property Office, the disclosure of which is incorporated by reference in its entirety.

FIELD

The present inventive concept relates to analog-to-digital converters, and more particularly to an analog-to-digital converter with disparate domain successive approximation registers.

DISCUSSION OF RELATED ART

An analog-to-digital converter (ADC) is a device used for sampling an analog signal, and converting the sampled analog signal into a digital signal. Among analog-to-digital converters, a successive approximation register (SAR) ADC uses a conversion method that performs quantization based on a binary search. The SAR ADC determines an upper bit to a lower bit at one clock for each bit. The SAR ADC has an N-bit digital-to-analog converter (DAC) and a comparator therein. In addition, a pipeline ADC uses a digital conversion method that processes with low resolution at each pipeline stage and adds a digital output at each stage, where a DAC and an amplifier are used in each stage.

SUMMARY

An exemplary embodiment of the present disclosure may provide a pipeline successive approximation register (SAR) analog-to-digital converter (ADC) of high power efficiency and speed by employing low-power amplification technology. An exemplary embodiment may provide an ADC in which a time-to-digital converter (TDC) is added to a rear stage of a voltage-current domain pipeline SAR ADC. In addition, an exemplary embodiment may provide a voltage-current-time domain three-stage pipeline ADC that matches a full-scale range of a current-time converter (ITC) output and a full-scale range of a time-to-digital converter (TDC).

According to an exemplary embodiment, an analog-to-digital converter includes a voltage-digital converter receiving an analog input voltage, generating a first digital signal from the analog input voltage, and outputting a residual output voltage remaining after generating the first digital signal, a voltage-time converter converting a residual output current based on the residual output voltage into a residual input time in a time domain, and a time-digital converter receiving the residual input time, and generating a second digital signal from the residual input time. The first digital signal and the second digital signal are sequences of digital codes representing respective signal levels of the analog input voltage.

According to an exemplary embodiment, an analog-to-digital converter includes a converter receiving an analog input signal in a first period, generating a digital signal from the analog input signal using a successive approximation register (SAR) method, and outputting a first residual current and a second residual current remaining after generating the digital signal, a first capacitor charged with the first residual current during a turn-on time of a sampling clock in a second period after the first period, a second capacitor charged with the second residual current during the turn-on time of the sampling clock in the second period, a first current source supplying a first discharge current for discharging the first capacitor, a second current source through which a second discharge current flows for discharging the second capacitor, a first comparator, wherein the first capacitor is discharged with the first discharge current in a third period after the second period, the first comparator comparing a voltage of a first node between the first capacitor and the first current source with a reference voltage, and outputting a point in time at which the voltage of the first node reaches the reference voltage as a first residual time, and a second comparator, wherein the second capacitor is discharged with the second discharge current in the third period, the second comparator comparing a voltage of a second node between the second capacitor and the second current source with the reference voltage, and outputting a point in time at which the voltage of the second node reaches the reference voltage as a second residual time. The digital signal is a portion of sequences of digital codes representing respective signal levels of the analog input current.

According to an exemplary embodiment, an analog-to-digital converter includes a current-time converter converting a residual output current remaining after generating a first digital signal from an analog input voltage using a successive approximation register (SAR) method into a residual input time in a time domain, and a time-digital converter receiving the residual input time, and generating a second digital signal from the residual input time. The current-time converter includes a capacitor charged with the residual output current during a turn-on time of a sampling clock, a current source supplying a discharge current for discharging the capacitor, and a comparator comparing a voltage of a node between the capacitor discharged with the discharge current and the current source with a reference voltage, and outputting a point in time at which the voltage of the node reaches the reference voltage as the residual input time. The first digital signal and the second digital signal are sequences of digital codes representing respective signal levels of the analog input voltage.

According to an exemplary embodiment, an analog-to-digital converter includes a voltage-current converter receiving an analog input voltage, generating a first digital signal from the analog input voltage using a successive approximation register (SAR) method, and outputting a residual current remaining after generating the first digital signal, a current-time converter converting the residual current into a residual time in a time domain, and a time-digital converter receiving the residual time, and generating a second digital signal from the residual time. The first digital signal and the second digital signal are sequences of digital codes representing respective signal levels of the analog input voltage, and a full-scale range of the residual time, which is an output of the current-time converter, matches a full-scale range of the time-digital converter.

According to an exemplary embodiment, an analog-to-digital converter includes an analog-time converter converting a residual output current based on a residual output voltage remaining after generating a first digital signal from an analog input voltage using a successive approximation register (SAR) method into a residual time in a time domain, and a time-digital converter receiving the residual time, and generating a second digital signal from the residual time. A full-scale range of the residual time, which is an output of the analog-time converter, matches a full-scale range of the time-digital converter.

According to an exemplary embodiment, an analog-to-digital converter includes: a first stage having an analog signal input terminal of a first domain, a signal processing section of the first domain, a digital signal output terminal, and a residual analog signal output terminal of a second domain; and a second stage having an analog signal input terminal of the second domain, a signal processing section of the second domain, and a second digital signal output terminal, wherein the first and second domains are different from each other and selected from a voltage domain, a current domain, a time domain, or a frequency domain.

The analog-to-digital converter may be configured where the first domain is the voltage domain, and the second domain is the current domain. The analog-to-digital converter may be configured where at least one of the first or second domains is the voltage or current domain, and the corresponding at least one of the first or second signal processing sections comprises successive approximation registers (SAR). The analog-to-digital converter may include digital calibration logic connected to each of the first and second digital signal output terminals.

The analog-to-digital converter may be configured where the second stage has a second residual analog signal output terminal of a third domain, and may include a third stage having an analog signal input terminal of the third domain, a signal processing section of the third domain, and a third digital signal output terminal, where the third domain is different from each of the first and second domains and selected from a voltage domain, a current domain, a time domain, or a frequency domain. The analog-to-digital converter may be configured where the first domain is the voltage domain, the second domain is the current domain, and the third domain is the time domain.

BRIEF DESCRIPTION OF DRAWINGS

Exemplary embodiments of the present disclosure will be more clearly understood from the following detailed description, taken in conjunction with the accompanying drawings, in which.

DETAILED DESCRIPTION

Hereinafter, exemplary embodiments of the present inventive concept may be described in detail with reference to the accompanying drawings.

Figure 1:
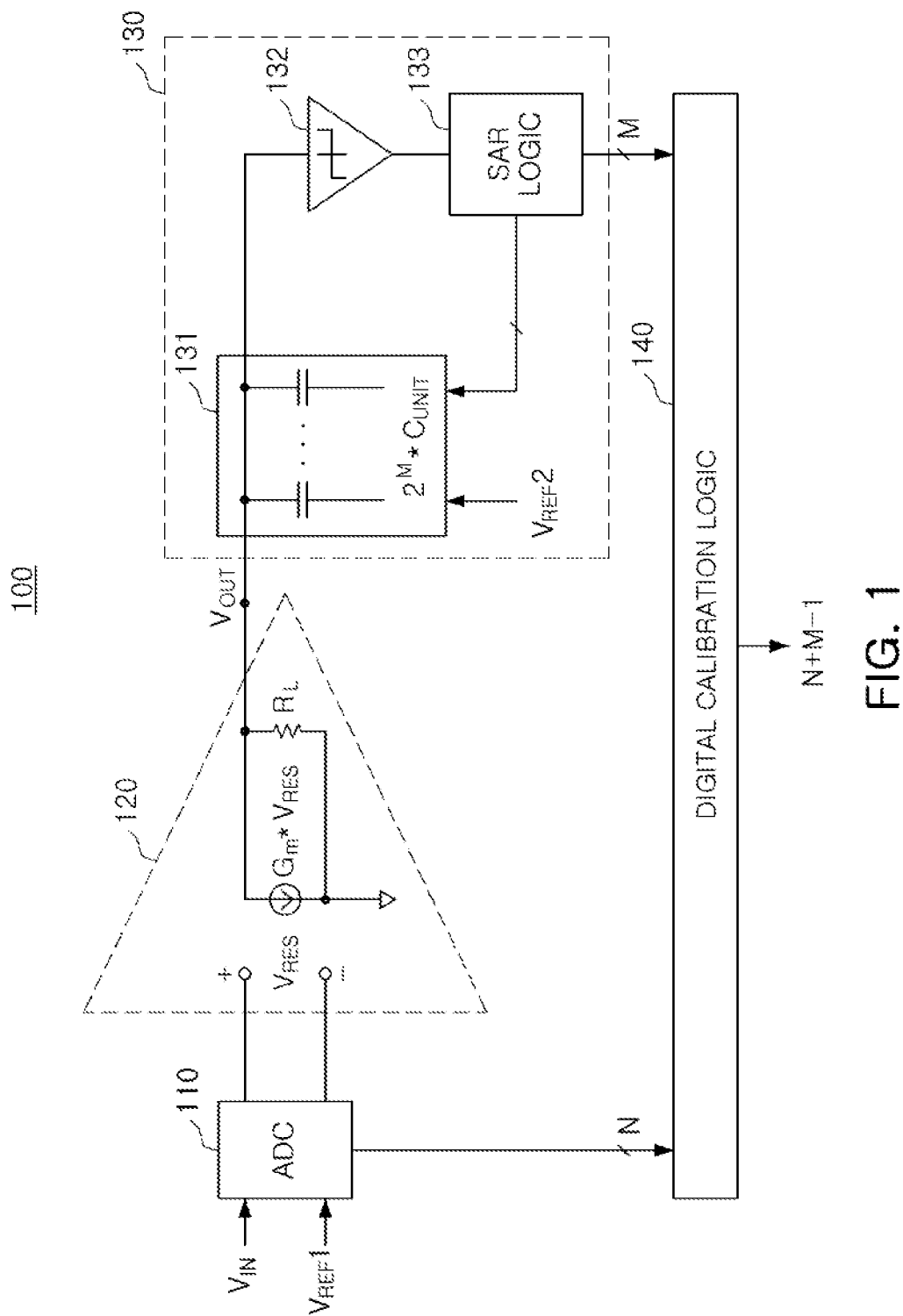
FIG. 1 is a schematic block diagram illustrating a voltage domain pipeline SAR ADC structure according to an exemplary embodiment of the present inventive concept.

FIG. 1 illustrates a voltage domain pipeline SAR ADC structure according to an exemplary embodiment of the present inventive concept.

Referring to FIG. 1, a voltage domain pipeline SAR ADC 100 may generate a sequence, such as an (N+M−1)-bit digital signal, of digital codes representing respective levels of an analog input voltage ($V_{IN}$) using a successive approximation resister (SAR) method. The voltage domain pipeline SAR ADC 100 may include a coarse ADC 110, an amplifier 120, a fine ADC 130, and digital calibration logic 140.

The coarse ADC 110 may include a capacitive digital-to-analog converter (CDAC), and the coarse ADC 110 may output an N-bit digital signal from the analog input voltage ($V_{IN}$) using a SAR method, without limitation. The coarse ADC 110 may receive the analog input voltage ($V_{IN}$) and a first reference voltage ($V_{REF}1$). The coarse ADC 110 may generate new reference voltages using the first reference voltage ($V_{REF}1$) until each bit of the N-bit digital signal is determined. The coarse ADC 110 may generate an N-bit digital signal using the analog input voltage ($V_{IN}$) and the new reference voltages by the SAR method. The coarse ADC 110 may output a residual voltage ($V_{RES}$) remaining after generating the N-bit digital signal.

The amplifier 120 may receive the residual voltage ($V_{RES}$) from the coarse ADC 110. The amplifier 120 may amplify the residual voltage ($V_{RES}$) by a predetermined voltage gain (Gm*RL) to output an output voltage ($V_{OUT}$) to the fine ADC 130.

The fine ADC 130 may output an M-bit digital signal from the output voltage ($V_{OUT}$) using the SAR method. The fine ADC 130 may include a CDAC 131, a comparator 132, and SAR logic 133. The CDAC 131 may receive the output voltage ($V_{OUT}$) from the amplifier 120. The CDAC 131 may sample the output voltage ($V_{OUT}$) and may maintain the sampled output voltage at a constant value for a period of time. That is, the output voltage $V_{OUT}$ can be a CDAC input voltage. The CDAC 131 may receive a second reference voltage ($V_{REF}2$), and generate a CDAC reference voltage using the second reference voltage ($V_{REF}2$). The CDAC 131 may output a differential voltage corresponding to a difference between the CDAC input voltage and the CDAC reference voltage.

The comparator 132 may compare the differential voltage and output a result of the comparison. The SAR logic 133 may receive the result of the comparison and output the uppermost bit digital signal based on the result of the comparison output from the comparator 132.

In addition, the SAR logic 133 may control the CDAC 131 so that the CDAC 131 can generate a new CDAC reference voltage based on the result of the comparison output from the comparator 132.

The CDAC 131 may output a differential voltage corresponding to a difference between the CDAC input voltage and the new CDAC reference voltage. The comparator 132 may compare the differential voltage and output a result of the new comparison. The SAR logic 133 may output a next bit digital signal based on the result of the new comparison output from the comparator 132.

The fine ADC 130 may perform a SAR method until all bits of the M-bit digital signal are determined from the output voltage ($V_{OUT}$).

The digital calibration logic 140 may receive the N-bit digital signal from the coarse ADC 110 and may receive the M-bit digital signal from the fine ADC 130. When there is 1-bit redundancy between the coarse ADC 110 and the fine ADC 130, the digital calibration logic 140 may combine the N-bit digital signal and the M-bit digital signal to generate a total (N+M−1)-bit digital signal.

An operating speed of the amplifier 120 may be determined by an RC time constant (T) at an output node of the amplifier 120, as shown in Equation 1, below.

$$T = R_L * C_L$$

$$C_L = 2^M * C_{UNIT} \quad \text{[Equation 1]}$$

Here, $R_L$ may mean load resistance of the amplifier 120, and $C_L$ may mean capacitance at the output node of the amplifier 120. That is, $C_L$ may mean the total capacitance of the fine ADC 130. An operating speed of the pipeline of the ADC may be determined by the operating speed of the amplifier 120. In order to improve the operating speed of the amplifier 120, $R_L$ or $C_L$ may be reduced. However, considering a minimum value required to determine noise and linearity performance of the fine ADC, there is a limit in reducing $R_L$ and $C_L$, and thus there is a corresponding limit in improving the operating speed of the amplifier 120 by such means.

According to an exemplary embodiment of the present inventive concept, an ADC can process a residual voltage ($V_{RES}$) of the coarse ADC 110 in a current domain. Therefore, it is possible to further improve an operating speed of an ADC pipeline.

Figure 2:
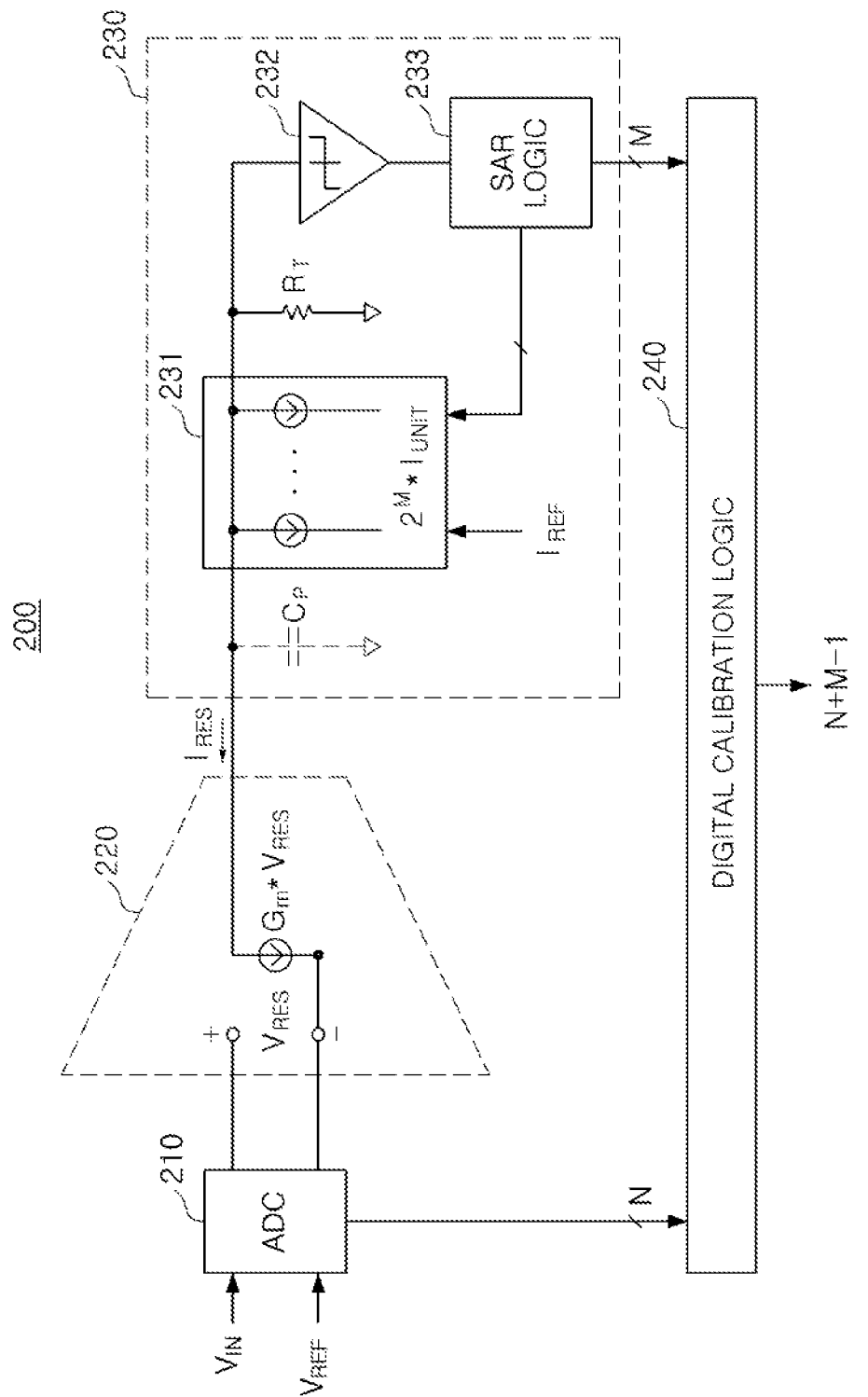
FIG. 2 is a schematic block diagram illustrating a voltage-current domain pipeline SAR ADC structure according to an exemplary embodiment of the present inventive concept.

FIG. 2 illustrates a voltage-current domain pipeline SAR ADC structure according to an exemplary embodiment of the present inventive concept.

Referring to FIG. 2, a voltage-current domain pipeline SAR ADC 200 may include a coarse ADC 210, an amplifier 220, a fine ADC 230, and digital calibration logic 240. The coarse ADC 210 may output an N-bit digital signal from an analog input voltage ($V_{IN}$) using a SAR method, without limitation. Since a structure and an operation of the coarse ADC 210 of FIG. 2 is similar to the structure and the operation of the coarse ADC 110 of FIG. 1, detailed descriptions thereof may be omitted.

The amplifier 220 may receive a differential residual voltage ($V_{RES}$) from the coarse ADC 210. The amplifier 220 may perform voltage-current conversion of the differential residual voltage ($V_{RES}$) to a differential residual current ($I_{RES}$) in a current domain. For example, the amplifier 220 may amplify the differential residual voltage ($V_{RES}$) by a predetermined gain Gm to generate a differential residual current ($I_{RES}$). In addition, the amplifier 220 may sample the generated differential residual current ($I_{RES}$) and maintain the sampled differential residual current at a constant value for a period of time. There may be a parasitic capacitance ($C_P$) at the output node of the amplifier 220.

The fine ADC 230 may include a current digital-to-analog converter (IDAC) 231, a resistor ($R_T$), a comparator 232, and SAR logic 233. The IDAC 231 may receive the differential residual current sampled from the amplifier 220. The sampled differential residual current may be an IDAC input current. The IDAC 231 may further receive a reference current ($I_{REF}$), and generate an IDAC reference current using the reference current ($I_{REF}$). The IDAC 231 may output a differential voltage corresponding to a difference between the IDAC input current and the IDAC reference current using a resistor ($R_T$).

The comparator 232 may compare the differential voltage and output the result of the comparison. The SAR logic 233 may output an uppermost bit digital signal based on the result of the comparison output from the comparator 232.

In addition, the SAR logic 233 may control the IDAC 231 so that the IDAC 231 can generate a new IDAC reference current based on the result of the comparison output from the comparator 232.

The IDAC 231 may output a new differential voltage corresponding to the difference between the IDAC input current and the new IDAC reference current. The comparator 232 may compare the new differential voltage and output a result of the comparison. The SAR logic 233 may output a next bit digital signal based on the result of the comparison output from the comparator 232.

The fine ADC 230 may perform the SAR method until all bits of the M-bit digital signal are determined from the differential residual current ($I_{RES}$).

The digital calibration logic 240 may receive the N-bit digital signal from the coarse ADC 210 and the M-bit digital signal from the fine ADC 230. When there is a 1-bit redundancy between the coarse ADC 210 and the fine ADC 230, without limitation, the digital calibration logic 240 may combine the N-bit digital signal and the M-bit digital signal to generate an (N+M−1)-bit digital signal.

The voltage-current domain pipeline SAR ADC 200, according to an exemplary embodiment of the present inventive concept, may process the differential residual voltage ($V_{RES}$) in the current domain. That is, the voltage-current domain pipeline SAR ADC 200 may increase an operating speed of an amplifier 220 capable of converting and sampling the differential residual voltage ($V_{RES}$) into a differential residual current ($I_{RES}$), and an operating speed of an amplifier 220, by including a fine ADC 230 processing the differential residual current ($I_{RES}$). The operating speed of the amplifier 220 may be determined by a RC time constant (T) at an output node of the amplifier 220, as shown in Equation 2, below.

$$T = R_T * C_P \quad \text{[Equation 2]}$$

Here, $R_T$ may be a load resistance at an output node of the amplifier 220, and $C_P$ may mean a parasitic capacitance at the output node of the amplifier 220. In FIG. 2, the parasitic capacitance ($C_P$) at the output node of the amplifier 220 may be sufficiently greater than a capacitance ($C_L$) at the output node of the amplifier 120 of FIG. 1 through an appropriate bias of the IDAC 231 and a corresponding layout design. Therefore, it is possible to improve an operating speed of an ADC pipeline.

Figure 3:
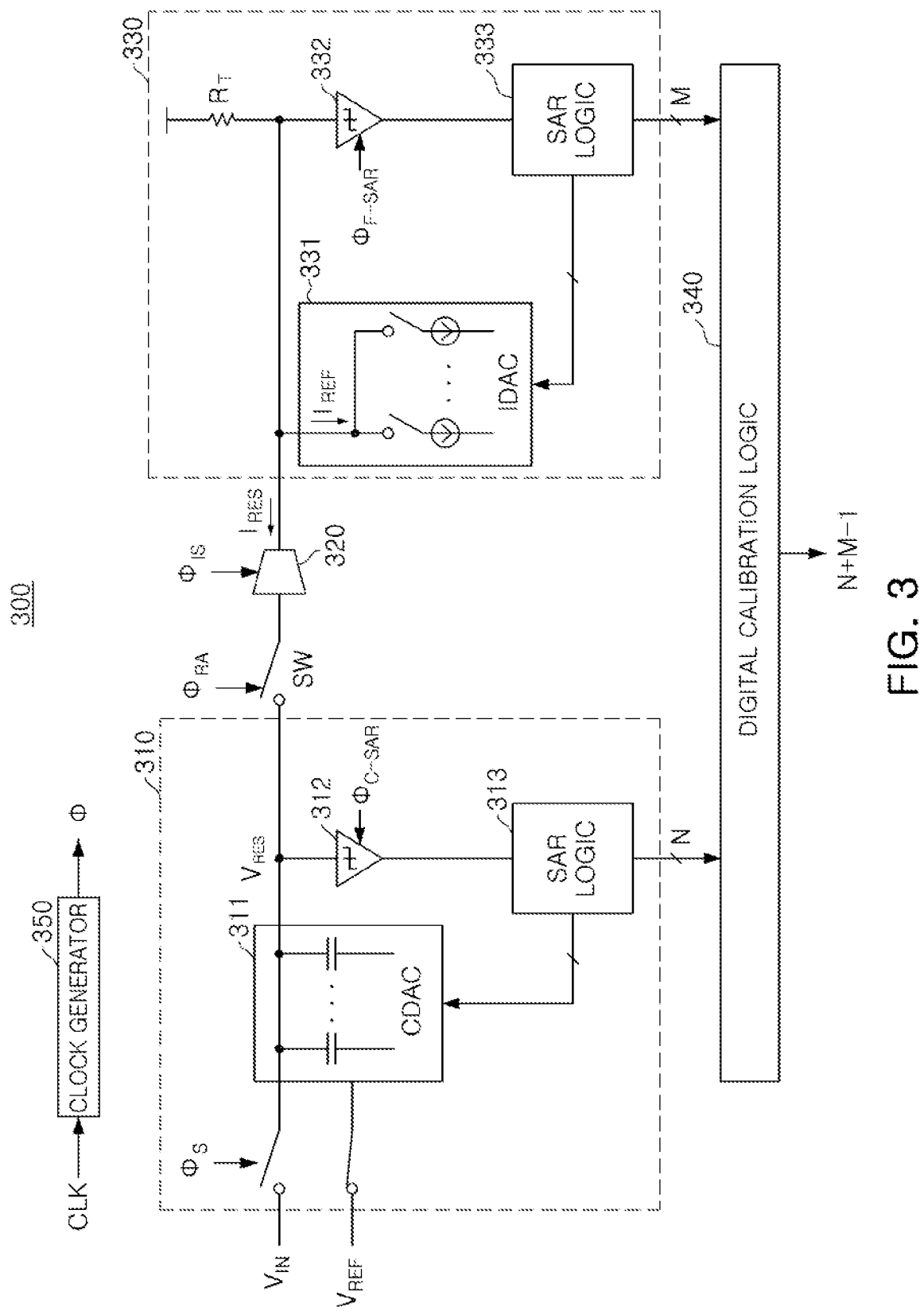
FIG. 3 is a schematic block diagram illustrating a voltage-current domain pipeline SAR ADC according to an exemplary embodiment of the present inventive concept.
Figure 4:
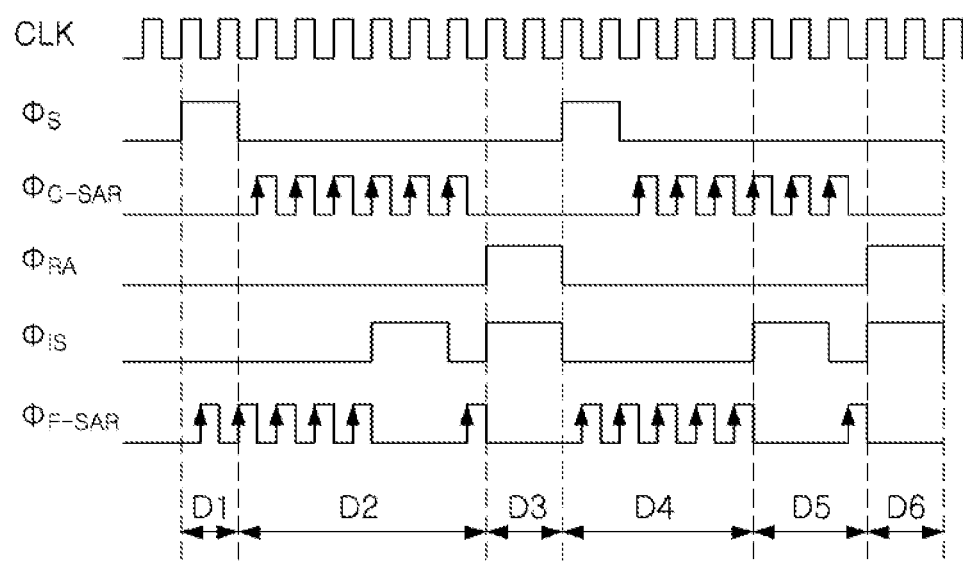
FIG. 4 is a graphical signal timing diagram illustrating operation of a voltage-current domain pipeline SAR ADC of FIG. 3.
Figure 5:
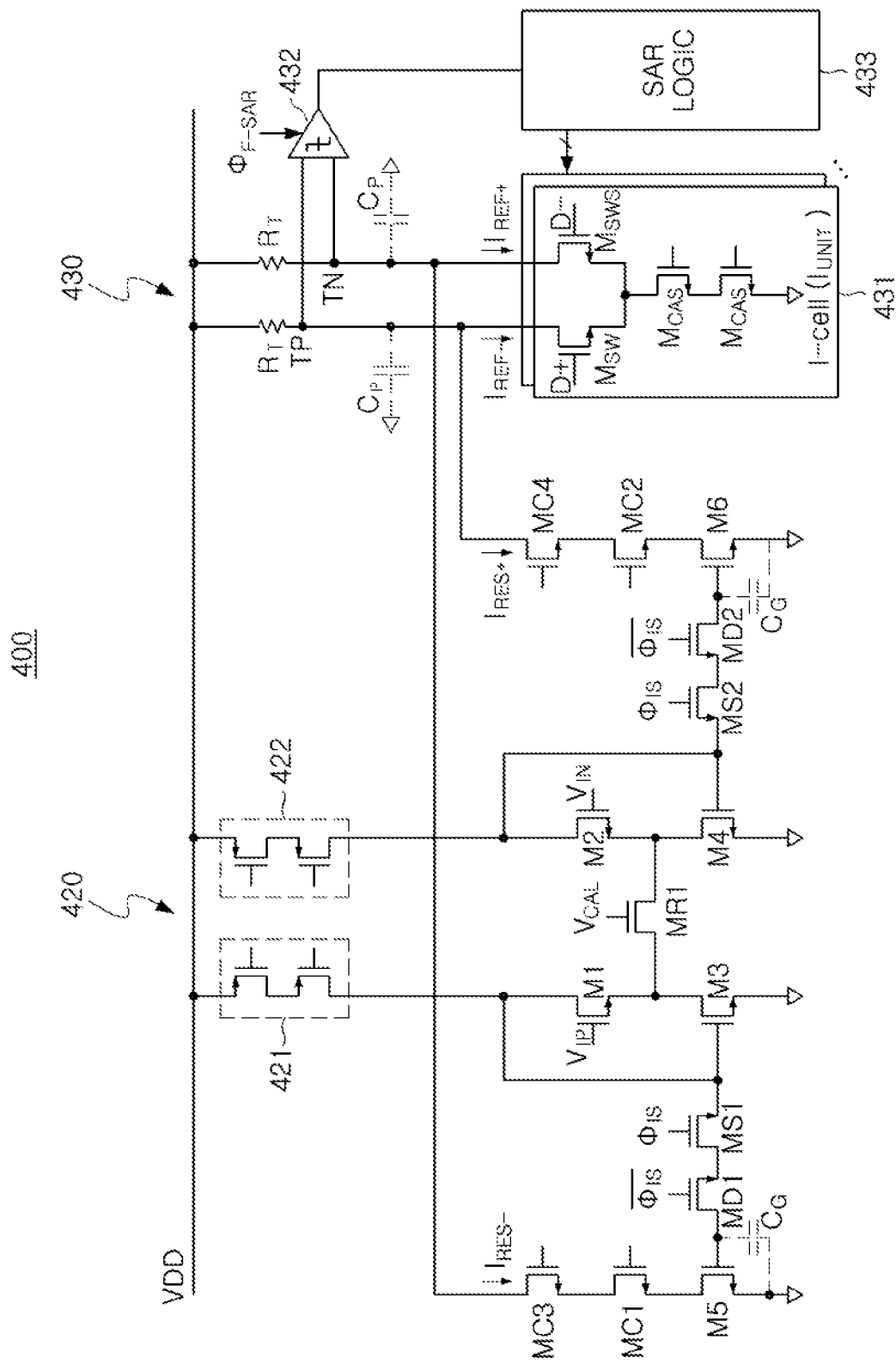
FIG. 5 is a schematic circuit diagram illustrating a voltage-current domain pipeline SAR ADC of FIG. 3.

FIGS. 3 to 5 illustrate a voltage-current domain pipeline SAR ADC operation according to an exemplary embodiment of the present inventive concept.

Referring to FIG. 3, a voltage-current domain pipeline SAR ADC 300 may include a coarse ADC 310, an amplifier 320, a fine ADC 330, digital calibration logic 340, a clock signal generator 350, and a switch SW.

The coarse ADC 310 may output an N-bit digital signal from an analog input voltage ($V_{IN}$) using a SAR method, without limitation. The coarse ADC 310 may include a capacitive digital-to-analog converter (CDAC) 311, a comparator 312, and SAR logic 313. The CDAC 311 may sample the analog input voltage ($V_{IN}$) in response to a first sampling clock signal ($\Phi_S$), and maintain the sampled analog signal at a constant value for a period of time. The analog input signal can be a CDAC input voltage. The CDAC 311 may receive a reference voltage ($V_{REF}$), and generate a CDAC reference voltage using the reference voltage ($V_{REF}$). The CDAC 311 may output a differential residual voltage ($V_{RES}$) corresponding to a difference between the CDAC input signal and the CDAC reference voltage.

The comparator 312 may compare the differential residual voltage ($V_{RES}$) in response to the first comparison clock signal ($\Phi_{C-SAR}$) and output a result of the comparison. The SAR logic 313 may output an uppermost bit digital signal based on a result of the comparison output from the comparator 312. For example, if the CDAC input signal is greater than the CDAC reference voltage, the SAR logic 313 may output a first logic value (e.g., data "1"). However, if the CDAC input signal is smaller than the CDAC reference voltage, the SAR logic 313 may output a second logic value (e.g., data "0").

In addition, the SAR logic 313 may control the CDAC 311 so that the CDAC 311 can generate a new CDAC reference voltage based on the result of the comparison output from the comparator 312.

The CDAC 311 may output a new differential residual voltage ($V_{RES}$) corresponding to a difference between the CDAC input signal and the new CDAC reference voltage. The comparator 312 may compare the new differential residual voltage ($V_{RES}$) in response to the first comparison clock signal ($\Phi_{C-SAR}$) and output a result of the comparison. The SAR logic 313 may output a next bit digital signal based on the result of the comparison output from the comparator 312.

The coarse ADC 310 may perform the SAR method until all bits of the N-bit digital signal are determined from the analog input voltage ($V_{IN}$). The coarse ADC 310 may output the differential residual voltage ($V_{RES}$) remaining after generating the N-bit digital signal.

The amplifier 320 may receive the differential residual voltage ($V_{RES}$) in response to a switch clock signal ($\Phi_{RA}$). The amplifier 320 may perform voltage-current conversion of the differential residual voltage ($V_{RES}$) to a differential residual current ($I_{RES}$) in the current domain. For example, the amplifier 320 may amplify the differential residual voltage ($V_{RES}$) by a predetermined gain Gm to generate a differential residual current ($I_{RES}$). In addition, the amplifier 320 may sample the generated differential residual current ($I_{RES}$) in response to a second sampling clock signal ($\Phi_{IS}$), and maintain the sampled differential residual current at a constant value for a period of time.

The fine ADC 330 may output an M-bit digital signal from a differential residual current ($I_{RES}$) using the SAR method. The fine ADC 330 may include an IDAC 331, a comparator 332, and SAR logic 333. The differential residual current ($I_{RES}$) may be an IDAC input current. The IDAC 331 may receive a reference current ($I_{REF}$), and generate an IDAC reference current using the reference current ($I_{REF}$). The IDAC 331 may output a differential voltage corresponding to the difference between the IDAC input current and the IDAC reference current using a resistor ($R_T$).

The comparator 332 may compare the differential voltage in response to the second comparison clock signal ($\Phi_{F-SAR}$) and output a result of the comparison. The SAR logic 333 may output an uppermost bit digital signal based on the result of the comparison output from the comparator 332.

In addition, the SAR logic 333 may control the IDAC 331 so that the IDAC 331 can generate a new IDAC reference current based on the result of the comparison output from the comparator 332.

The IDAC 331 may output a new differential voltage corresponding to the difference between the IDAC input current and the new IDAC reference current. The comparator 332 may compare the new differential voltage in response to the second comparison clock signal ($\Phi_{F-SAR}$) and output the result of the comparison. The SAR logic 333 may output a next bit digital signal based on the result of the comparison output from the comparator 332.

The fine ADC 330 may perform the SAR method until all bits of the M-bit digital signal are determined from the differential residual current ($I_{RES}$).

The digital calibration logic 340 may receive an N-bit digital signal from the coarse ADC 310 and an M-bit digital signal from the fine ADC 330. When there is a 1-bit redundancy between the coarse ADC 310 and the fine ADC 330, the digital calibration logic 340 may combine the N-bit digital signal and the M-bit digital signal to generate a total (N+M−1)-bit digital signal.

Referring to FIGS. 3 and 4 together, the clock generator 350 may generate a first sampling clock signal ($\Phi_S$), a first comparison clock signal ($\Phi_{C-SAR}$), a switch clock signal ($\Phi_{RA}$), a second sampling clock signal ($\Phi_{IS}$), and a second comparison clock signal ($\Phi_{F-SAR}$) in response to an input clock signal CLK. The first sampling clock signal ($\Phi_S$) may have a pulse width corresponding to 1.5 clock cycles. Each of the switch clock signal ($\Phi_{RA}$) and the second sampling clock signal ($\Phi_{IS}$) may have a pulse width corresponding to 2.0 clock cycles.

During each total of 10.0 clock cycles including periods D1 and D2 and D3, or periods D4 and D5 and D6 of FIG. 4, in which the first sampling clock signal ($\Phi_S$) and the switch clock signal ($\Phi_{RA}$) may each occur once and the second sampling clock signal ($\Phi_{IS}$) may occur twice, the first comparison clock signal ($\Phi_{C-SAR}$) may include 10.0-2.0-1.5=6.5 clock cycles, and the second comparison clock signal ($\Phi_{F-SAR}$) may include 10.0-2.0-2.0=6.0 inverted clock cycles.

In the first period D1, the analog input voltage ($V_{IN}$) may be sampled to the CDAC 311 during the first sampling clock signal ($\Phi_S$). In the second period D2, the analog input voltage ($V_{IN}$) may be converted into an N-bit digital signal and output by the comparator 312 and the SAR logic 313 during the first comparison clock signal ($\Phi_{C-SAR}$). When an operation of the coarse ADC 310 is completed, a differential residual voltage ($V_{RES}$) may remain in the CDAC 311.

In the third period D3, the differential residual voltage ($V_{RES}$) remaining in the CDAC 311 may be converted into a residual current ($I_{RES}$) by the amplifier 320 during the second sampling clock signal ($\Phi_{IS}$). When the total of 10 clock cycles end, the residual current ($I_{RES}$) can be sampled by the amplifier 320.

In the fourth period D4, an operation of the coarse ADC 310 may proceed as above with next data, while the residual current ($I_{RES}$) may be converted into an M-bit digital signal by the fine ADC 330 during the second comparison clock signal ($\Phi_{F-SAR}$) and output. In the fifth period D5, a calibration circuit may perform offset calibration and gain calibration of the amplifier 320 and the fine ADC 330 during these three clock cycles.

Referring to FIG. 5, a voltage-current domain pipeline SAR ADC 400 may include an amplifier 420 and a fine ADC 430.

The amplifier 420 may be configured as input stages M1 to M4 having a structure of a flipped voltage follower having a variable resistance MR1 for linear voltage-current conversion and switch current mirrors M5, M6, MS1, and MS2. The amplifier 420 may further include bias circuits 421 and 422 for driving transistors included in the input stages M1 to M4. The amplifier 420 may receive the output voltage $V_{RES}$ from the coarse ADC as differential residual voltages ($V_{IP}$ and $V_{IN}$).

The switch current mirrors M5, M6, MS1, and MS2 can hold charges in a gate capacitance ($C_G$) for current sampling. The amplifier 420 may use triple cascade current mirrors M5, M6, and MC1 to MC4, and dummy switches MD1 and MD2 for linearity of a voltage-to-current conversion gain. The amplifier 420 may convert differential residual voltages ($V_{IP}$ and $V_{IN}$) into differential residual currents ($I_{RES+}$ and $I_{RES-}$), and maintain charges corresponding to the differential residual currents ($I_{RES+}$ and $I_{RES-}$) in the gate capacitance ($C_G$) by the sampling clock signal ($\Phi_{IS}$). The differential residual currents ($I_{RES+}$ and $I_{RES-}$) may thereby be sampled and the sampled residual currents may be maintained at a constant value for a predetermined period of time.

The fine ADC 430 may include an IDAC 431, a comparator 432, a SAR logic 433, and a resistor ($R_T$). A residual current sampled by the amplifier 412 may be the IDAC input current. The IDAC 431 may generate differential reference currents ($T_{REF+}$ and $T_{REF-}$) using the IDAC reference current. The IDAC 431 may output differential voltages TP and TN corresponding to a difference between the IDAC input current and the IDAC reference current using a resistor ($R_T$).

The comparator 432 may compare the differential voltages TP and TN in response to the second comparison clock signal ($\Phi_{F-SAR}$), and output a result of the comparison. The SAR logic 433 may output an M-bit digital signal based on the result of the comparison output from the comparator 432.

The voltage-current domain pipeline SAR ADC 400 according to an exemplary embodiment of the present inventive concept may sufficiently reduce a parasitic capacitance ($C_P$) at an output node of the amplifier 420 to improve the operating speed of the ADC. In addition, as a semiconductor is scaled down, a power supply voltage VDD may be reduced, and the voltage-current domain pipeline SAR ADC 400 according to an exemplary embodiment of the present inventive concept may be operated even at such a reduced power supply voltage VDD.

Figure 6:
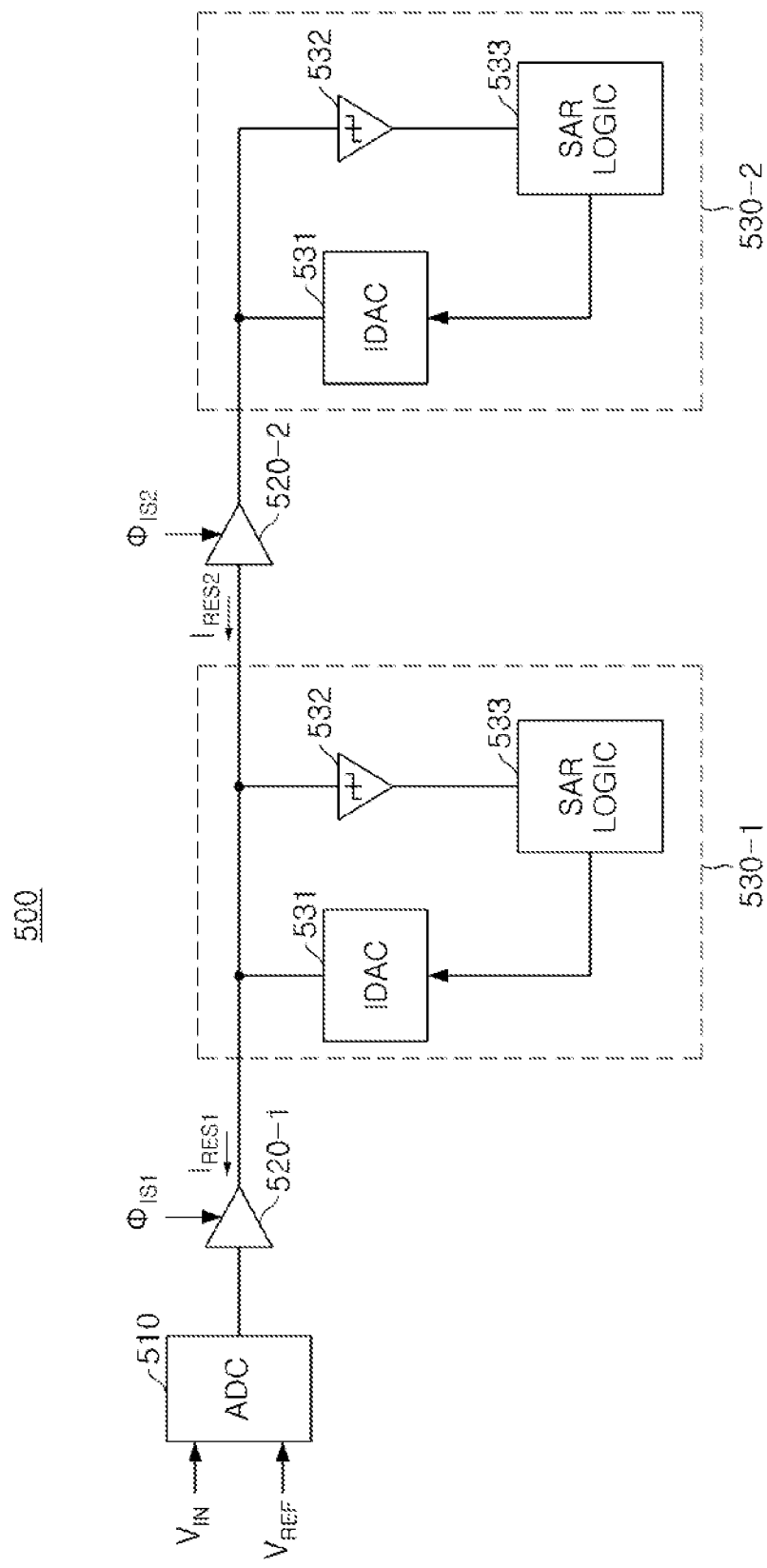
FIG. 6 is a schematic block diagram illustrating a structure of a voltage-current domain pipeline SAR ADC according to an exemplary embodiment of the present inventive concept.

FIG. 6 illustrates a voltage-current domain pipeline SAR ADC structure according to an exemplary embodiment of the present inventive concept. The voltage-current domain pipeline SAR ADC 500 of FIG. 6 may additionally implement a pipeline in a current domain through an amplifier with a sampling and a hold operation and a SAR ADC using an IDAC, unlike the voltage-current domain pipeline SAR ADC 200 of FIG. 2. Otherwise, duplicate description may be omitted.

The voltage-current domain pipeline SAR ADC 500 includes a coarse ADC 510, a first amplifier 520-1, a first fine ADC 530-1, a second amplifier 520-2, and a second fine ADC 530-2.

For example, assuming that the coarse ADC 210 may output a 6-bit digital signal and the fine ADC 230 may output a 5-bit digital signal in FIG. 2; in FIG. 6, the coarse ADC 510 may output a 6-bit digital signal, the first fine ADC 530-1 may output a 2-bit digital signal, and the second fine ADC 530-2 may output a remaining 4-bit digital signal, without limitation thereto.

Specifically, the first amplifier 520-1 may sample a first residual current ($I_{RES1}$) in response to the first sampling clock signal ($\Phi_{IS1}$). The first fine ADC 530-1 may output the first residual current ($I_{RES1}$) as a 2-bit digital signal.

When the operation of the first fine ADC 530-1 is completed, a second residual current ($I_{RES2}$) may remain in the IDAC 531 of the first fine ADC 530-1. The second amplifier 520-2 may sample the second residual current ($I_{RES2}$) in response to the second sampling clock signal ($\Phi_{IS2}$). The second fine ADC 530-2 may output 4 bits of the second residual current ($I_{RES2}$) as a 4-bit digital signal. The structure and operation of the first fine ADC 530-1 and the second fine ADC 530-2 of FIG. 6 are similar to the structure and operation of the fine ADC 230 of FIG. 2, so a duplicate detailed description thereof may be omitted.

The voltage-current domain pipeline SAR ADC 500 according to an exemplary embodiment of the present inventive concept has an effect of having high resolution while maintaining a high-speed operation. However, an IDAC using an added static current in the current domain can increase power consumption of an entire ADC.

According to an exemplary embodiment of the present inventive concept, a pipeline using a time-to-digital converter (TDC) in a time domain may be implemented instead of or in addition to one or more of the fine ADC added in the current domain. Therefore, power consumption of the ADC can be minimized.

Figure 7:
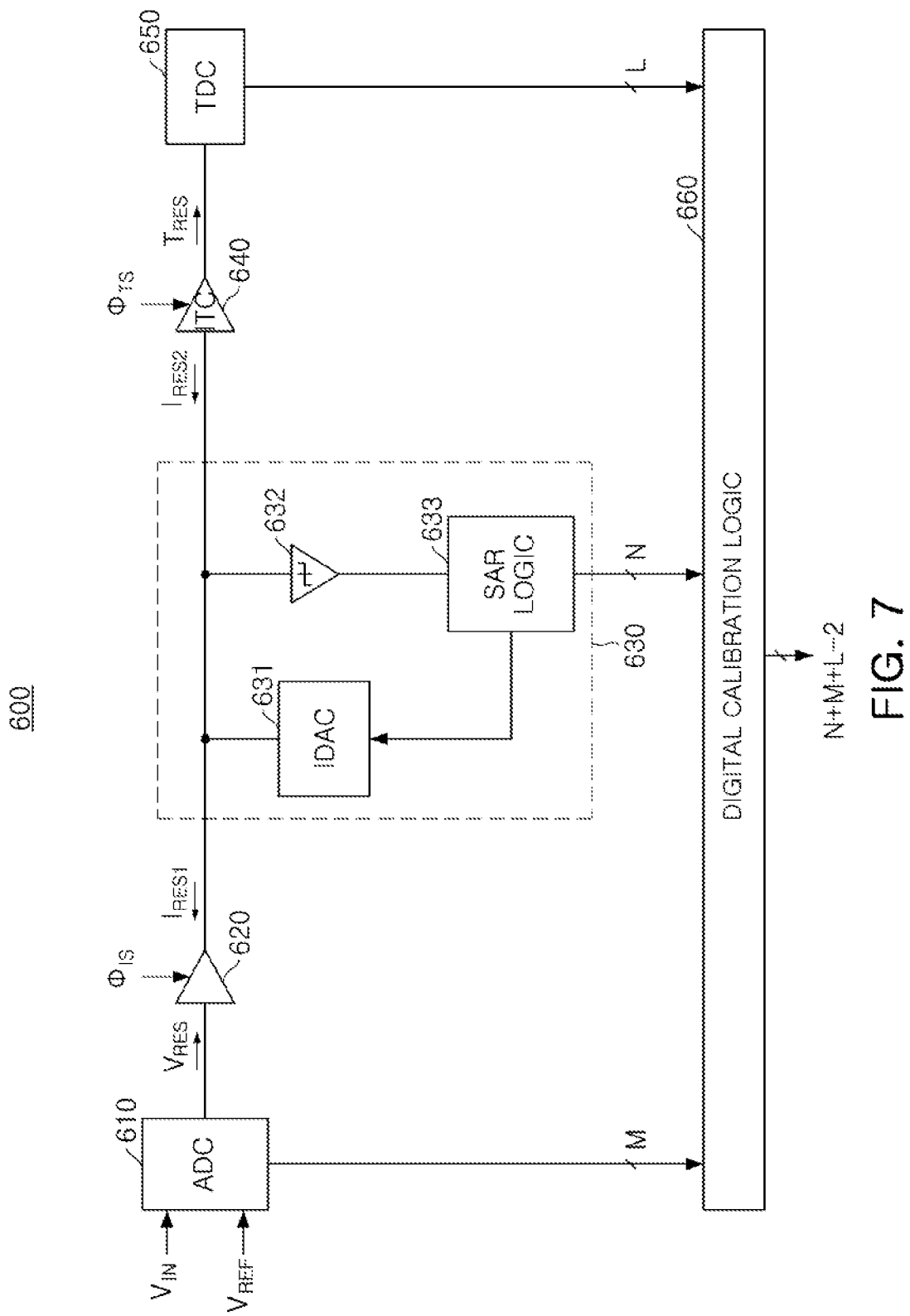
FIG. 7 is a schematic block diagram illustrating a voltage-current-time domain pipeline ADC structure according to an exemplary embodiment of the present inventive concept.

FIG. 7 illustrates a voltage-current-time domain pipeline ADC structure according to an exemplary embodiment.

Referring to FIG. 7, a voltage-current-time domain pipeline ADC 600 may generate a sequence, such as an (M+N+L−2)-bit digital signal, of digital codes representing respective levels of an analog input voltage ($V_{IN}$) using an ADC in a voltage domain, a current domain, and a time domain. The voltage-current-time domain pipeline SAR ADC 600 may include a coarse ADC 610, an amplifier 620, a fine ADC 630, a current-time converter 640 (ITC), a time-digital converter (TDC) 650, and digital calibration logic 660.

The coarse ADC 610 may output an M-bit digital signal from the analog input voltage ($V_{IN}$) using the SAR method. The amplifier 620 may receive a residual voltage ($V_{RES}$) from the coarse ADC 610, and may amplify the residual voltage ($V_{RES}$) to generate a first residual current ($I_{RES}1$) in a current domain. The amplifier 620 may sample the first residual current ($I_{RES}1$) in response to the first sampling clock signal ($\Phi_{IS}$), and maintain the sampled first residual current at a constant value for a predetermined period of time.

The fine ADC 630 may include an IDAC 631, a comparator 632, and SAR logic 633. The IDAC 631 may receive a sampled first residual current from the amplifier 620. The sampled first residual current may be a first IDAC input current. The IDAC 631 may receive a reference current, and generate an IDAC reference current using the reference current. The IDAC 631 may output a difference between the IDAC input current and the IDAC reference current.

The comparator 632 may compare the difference between the IDAC input current and the IDAC reference current and output a result of the comparison. The SAR logic 633 can output an uppermost bit digital signal based on the result of the comparison output from the comparator 632.

In addition, the SAR logic 633 can control the IDAC 631 so that the IDAC 631 can generate a new IDAC reference current based on the result of the comparison output from the comparator 632.

The IDAC 631 may output a new difference between the IDAC input current and the new IDAC reference current. The comparator 632 may compare the new difference between the IDAC input current and the new IDAC reference current and output a result of the comparison. The SAR logic 633 may output a next bit digital signal based on the result of the comparison output from the comparator 632.

The fine ADC 630 may perform the SAR method until all bits of the N-bit digital signal are determined from the first residual current ($I_{RES}1$).

When an operation of the fine ADC 630 is completed, a second residual current ($I_{RES2}$) may remain in the IDAC 631 of the fine ADC 630. In response to a complementary signal of the second sampling clock signal ($\Phi_{TS}$), the ITC 640 may receive the second residual current ($I_{RES}2$) from the fine ADC 630. In response to the second sampling clock signal ($\Phi_{TS}$), the ITC 640 may perform current-time conversion of the second residual current ($I_{RES2}$) to the residual time signal ($T_{RES}$) in the time domain.

The TDC 650 may receive the residual time signal ($T_{RES}$) from the ITC 640, and output an L-bit digital signal.

The digital calibration logic 660 may receive an M-bit digital signal from the coarse ADC 610, may receive an N-bit digital signal from the fine ADC 630, and may receive an L-bit digital signal from the TDC 650. When there is a 1-bit redundancy between the coarse ADC 610 and the fine ADC 630, without limitation, and when there is a 1-bit redundancy between the fine ADC 630 and the TDC 650, without limitation, the calibration logic 660 may combine the M-bit digital signal, the N-bit digital signal, and the L-bit digital signal to generate an (M+N+L−2)-bit digital signal.

The voltage-current-time domain pipeline ADC 600 according to an exemplary embodiment of the present inventive concept may pipeline using a time domain ADC (i.e., TDC) at a rear stage of the voltage-current domain pipeline SAR ADC. Therefore, power consumption of the voltage-current-time domain pipeline ADC may be minimized.

Gain mismatch between different domains may lead to a deterioration in linearity performance in the entire ADC. Delay cells processing the residual time signal ($T_{RES}$) in the TDC 650 may be sensitive to changes in process-voltage-temperature (PVT).

According to an exemplary embodiment of the present inventive concept, a full-scale range of the ITC 640 output and a full-scale range of the TDC 650 may be matched. Thus, the ADC may be less burdened with complex calibration techniques or PVT variations.

Figure 8:
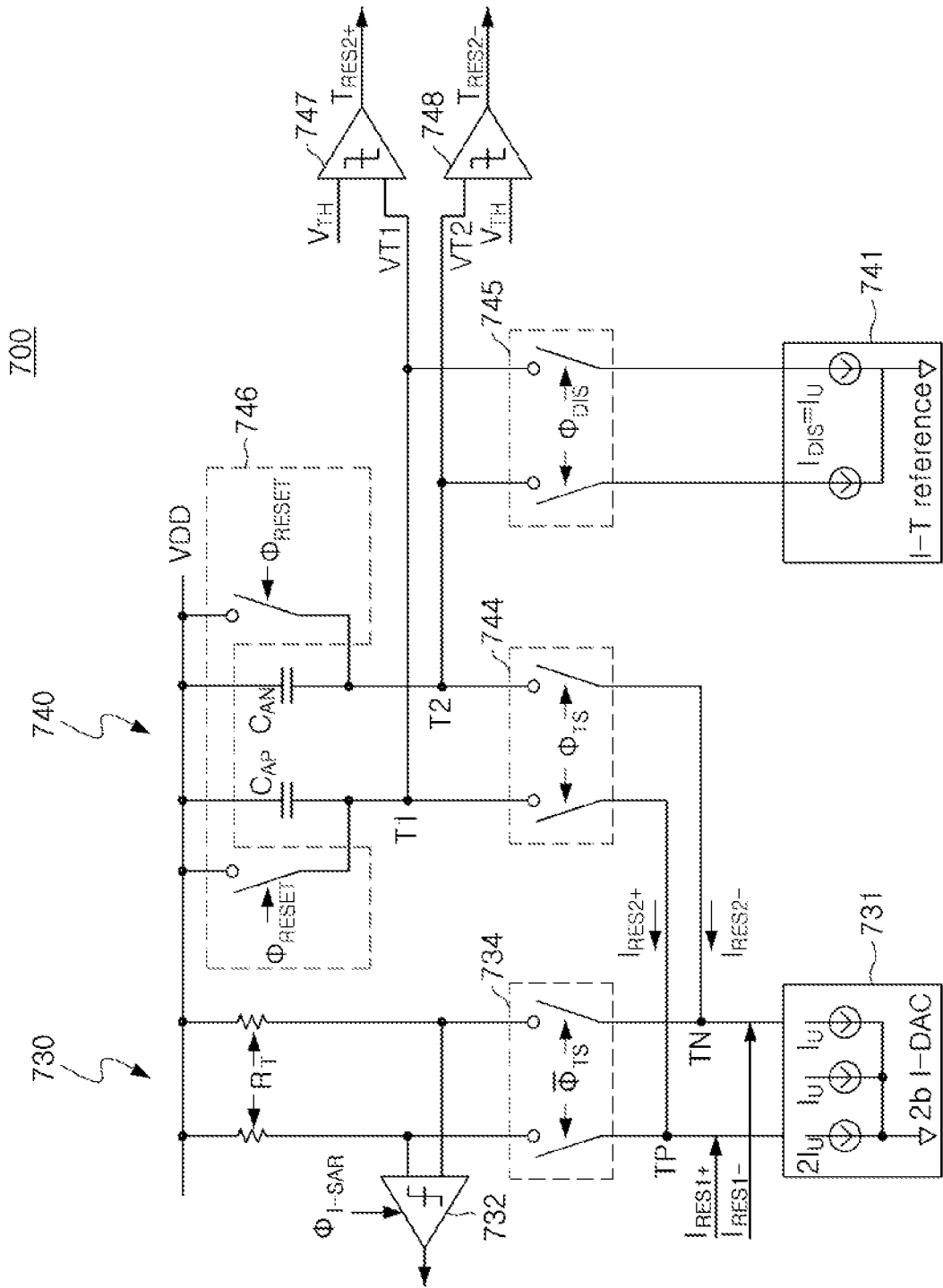
FIG. 8 is a schematic circuit diagram illustrating operation of the voltage-current-time domain pipeline ADC of FIG. 7.
Figure 9:
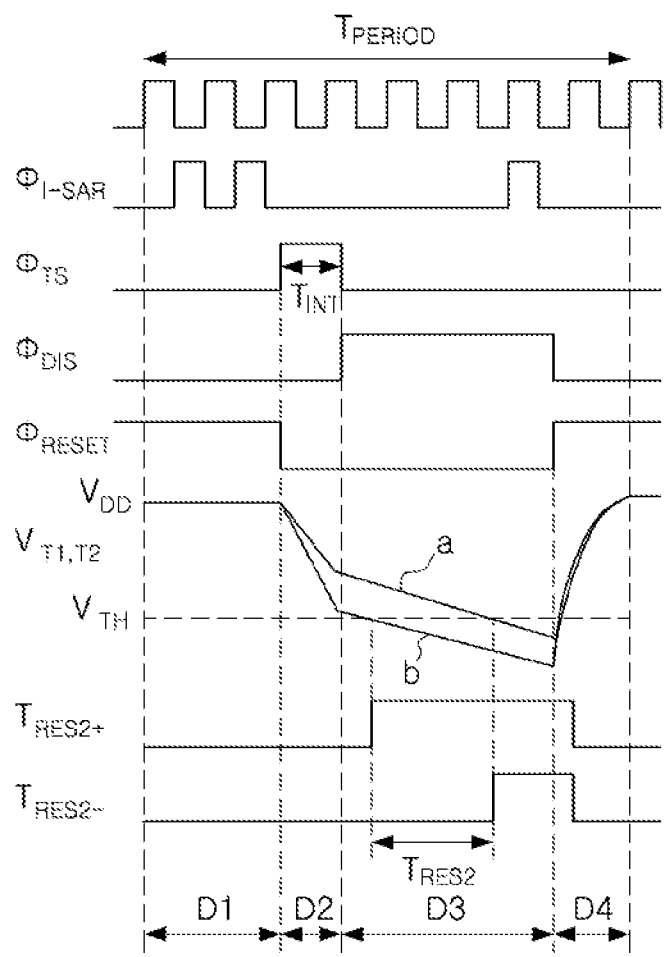
FIG. 9 is a graphical signal timing diagram illustrating operation of the voltage-current-time domain pipeline ADC of FIG. 8.

FIGS. 8 and 9 illustrate an operation of a voltage-current-time-domain pipeline ADC according to an exemplary embodiment of the present inventive concept. In particular, FIGS. 8 and 9 will mainly be described with respect to a circuit and an operation principle of a current-time converter. Duplicate description may be omitted.

Referring to FIG. 8, a voltage-current-time domain pipeline ADC 700 may include a fine ADC 730 and an ITC 740. The fine ADC 730 may include an IDAC 731, resistors ($R_T$), a comparator 732, and a switch 734.

The switch 734 may be turned on in response to a complementary signal of a sampling clock signal ($\Phi_{IN}$). First differential residual currents ($I_{RES1+}$ and $I_{RES1−}$) sampled from the amplifier 620 of FIG. 7 may be input currents of the IDAC 731. The IDAC 731 may generate a differential reference current using an IDAC reference current. The IDAC 731 may output differential voltages at nodes TP and TN corresponding to a difference between the IDAC input current and the IDAC reference current using resistors ($R_T$).

The comparator 732 may compare the differential voltages at nodes TP and TN in response to a comparison clock signal ($\Phi_{I-SAR}$), and output the result of the comparison. The SAR logic can output an uppermost bit digital signal based on the result of the comparison output from the comparator 732.

In addition, the SAR logic can control the IDAC 731 so that the IDAC 731 can generate a new IDAC reference current based on the result of the comparison output from the comparator 732.

The IDAC 731 may output the new differential voltages TP and TN corresponding to the difference between the IDAC input current and the new IDAC reference current. The comparator 732 may compare the new differential voltages at nodes TP and TN in response to the comparison clock signal ($\Phi_{I-SAR}$) and output the result of the comparison. The SAR logic may output a next bit digital signal based on the result of the comparison output from the comparator 732.

The fine ADC 730 may perform the SAR method until all bits of the digital signal are determined from the first differential residual currents ($I_{RES1+}$ and $I_{RES1−}$).

When an operation of the fine ADC 730 is completed, second differential residual currents ($I_{RES2+}$ and $I_{RES2−}$) may remain in the IDAC 731.

The ITC 740 may include a current source 741, first to third switches 744, 745, and 746, a first capacitor ($C_{AP}$), a second capacitor ($C_{AN}$), a first comparator 747, and a second comparator 748.

Referring to FIGS. 8 and 9 together, the switch 734 of the fine ADC 730 in a first period D1 is turned on in response to the complementary signal of the sampling clock signal ($\Phi_{TS}$), and the first switch 744 of the ITC 740 may be turned off in response to the sampling clock signal ($\Phi_{TS}$). When the operation of the fine ADC 730 as described above in the first period D1 is completed, the second differential residual currents ($I_{RES2+}$ and $I_{RES2−}$) may remain in the IDAC 731.

As a third switch 746 is turned on in response to the reset clock signal ($\Phi_{RESET}$), the first capacitor ($C_{AP}$) and the second capacitor ($C_{AN}$) may be reset to a power voltage VDD. Therefore, the voltages of the first node T1 and the second node T2 may be the power supply voltage VDD.

In a second period D2 after the first period D1, the third switch 746 may be turned off in response to the reset clock signal ($\Phi_{RESET}$), and the first switch 744 may be turned on in response to the sampling clock signal ($\Phi_{TS}$), and the switch 734 of the fine ADC 730 may be turned off in response to the complementary signal of the sampling clock signal ($\Phi_{TS}$). During the turn-on time signal ($T_{INT}$) of the sampling clock signal ($\Phi_{TS}$), the first capacitor ($C_{AP}$) and the second capacitor ($C_{AN}$) may be charged with the second differential residual currents ($I_{RES2+}$ and $I_{RES2−}$). For example, the first capacitor ($C_{AP}$) may be charged with a first residual current, which is any one of the second differential residual currents ($I_{RES2+}$ and $I_{RES2−}$), and the second capacitor ($C_{AN}$) may be charged with a second residual current, which is the other one of the second differential residual current ($I_{RES2+}$ and $I_{RES2−}$).

In the second period D2, the voltages of the first node T1 and the second node T2 may decrease with different slopes. The voltages of the first node T1 and the second node T2 may decrease with slopes corresponding to the magnitudes of the first residual current ($I_{RES2+}$) and the second residual current ($I_{RES2-}$).

For example, when a unit current ($I_U$), which is a full-scale of the second differential residual currents ($I_{RES2+}$ and $I_{RES2-}$) is 0.4 µA, the first residual current ($I_{RES2+}$) is 0.7 µA, and the second residual current ($I_{RES2-}$) is 0.3 µA, plot "a" may represent voltage $V_{T2}$ at the node T2 based on the second residual current ($I_{RES2-}$) and plot "b" may represent the voltage $V_{T1}$ at the node T1 based on the first residual current ($I_{RES2+}$).

In the present specification, the full-scale or full-scale range of an output may mean a difference between a maximum value of the output and a minimum value of the output or a range between a maximum value of the output and a minimum value of the output, respectively.

In a third period D3 after the second period D2, the first switch 744 may be turned off in response to the sampling clock signal ($\Phi_{TS}$), and the second switch 745 may be turned on in response to a discharge clock signal ($\Phi_{DIS}$). A current source 741 may supply a discharge current ($I_{DIS}$) for discharging the first capacitor ($C_{AP}$) and the second capacitor ($C_{AN}$) charged with the second differential residual currents ($I_{RES2+}$ and $I_{RES2-}$), respectively. The current source 741 may include a first current source supplying a first discharge current for discharging the first capacitor ($C_{AP}$), and a second current source supplying a second discharge current for discharging the second capacitor ($C_{AN}$).

In this case, the magnitudes of the first discharge current and the second discharge current may be the same as the magnitudes of the unit currents ($I_U$), which are full-scales of the second differential residual currents ($I_{RES+}$ and $I_{RES2-}$), respectively. Accordingly, each of the first capacitor ($C_{AP}$) and the second capacitor ($C_{AN}$) can be discharged with the same current ($I_{DIS}=I_U$) during a discharge clock signal ($\Phi_{DIS}$), without limitation. Therefore, the voltages of the first node T1 and the second node T2 may decrease with substantially the same slope.

The first comparator 747 may compare the voltage of the first node T1 with the reference voltage ($V_{TH}$). The first comparator 747 may output a point in time at which the voltage of the first node T1 reaches the reference voltage ($V_{TH}$) as the first residual time signal ($T_{RES2+}$). The second comparator 748 may compare the voltage of the second node T2 with the reference voltage ($V_{TH}$). The second comparator 748 may output a point in time at which the voltage of the second node T2 reaches the reference voltage ($V_{TH}$) as the second residual time signal ($T_{RES2-}$).

In the third period D3, both the voltage of the first node T1 and the voltage of the second node T2 reach and/or drop below the reference voltage ($V_{TH}$). In a fourth period D4 after the third period D3, the second switch 745 may be turned off. The first capacitor ($C_{AP}$) and the second capacitor ($C_{AN}$) may be reset to a power supply voltage VDD in response to the reset clock signal ($\Phi_{RESET}$). For example, when both the first residual time signal ($T_{RES2+}$) and the second residual time signal ($T_{RES2}$) become logic high, there may be a logic delay supplying a reset clock signal ($\Phi_{RESET}$).

In the third period D3, by making the magnitude of the discharge current ($I_{DIS}$) for discharging the first capacitor ($C_{AP}$) and the second capacitor ($C_{AN}$) equal to the magnitude of the unit current ($I_U$), which is the full-scale of the second differential residual currents ($I_{RES2+}$, and $I_{RES2-}$), the following [Equation 3] can be satisfied.

$$T_{RES2}/I_{RES2}=T_{INT}/I_U$$

$$T_{RES}=T_{RES+}-T_{RES-}$$

$$I_{RES2}=I_{RES2+}-I_{RES2-} \quad \text{[Equation 3]}$$

Here, $T_{RES2}$ may be an ITC output, which is an interval between the first residual time signal ($T_{RES2+}$) and the second residual time signal ($T_{RES2-}$); $I_{RES2}$ may be a differential residual current of the fine ADC 740; $I_U$ may be a unit current ($I_{RES2}$), which is a full-scale of the differential residual current ($I_{RES2}$); and $T_{INT}$ may be a time in which charges corresponding to each of the second differential residual currents ($I_{RES2+}$ and $I_{RES2-}$) from the fine ADC 740 are accumulated in each of the first capacitor ($C_{AP}$) and the second capacitor ($C_{AN}$).

For example, when the first residual current ($I_{RES2+}$) is 0.7 µA and the second residual current ($I_{RES2-}$) is 0.3 µA, the ITC output ($T_{RES2}$) may be $+T_{INT}$. When the first residual current ($I_{RES2+}$) is 0.6 µA and the second residual current ($I_{RES2-}$) is 0.4 µA, the ITC output ($T_{RES2}$) may be $+T_{INT}/2$. When the first residual current ($I_{RES2+}$) is 0.5 µA and the second residual current ($I_{RES2-}$) is 0.5 µA, the ITC output ($T_{RES2}$) may be 0. When the first residual current ($I_{RES2+}$) is 0.3 µA and the second residual current ($I_{RES2-}$) is 0.7 µA, the ITC output ($T_{RES2}$) may be $-T_{INT}$.

That is, by making the magnitude of the discharge current ($I_{DIS}$) for discharging the first capacitor ($C_{AP}$) and the second capacitor ($C_{AN}$) equal to the magnitude of the unit current ($I_U$), which is the full-scale of the differential residual current ($I_{RES2}$), the ITC output ($T_{RES2}$) can be determined by $T_{INT}$.

Figure 10:
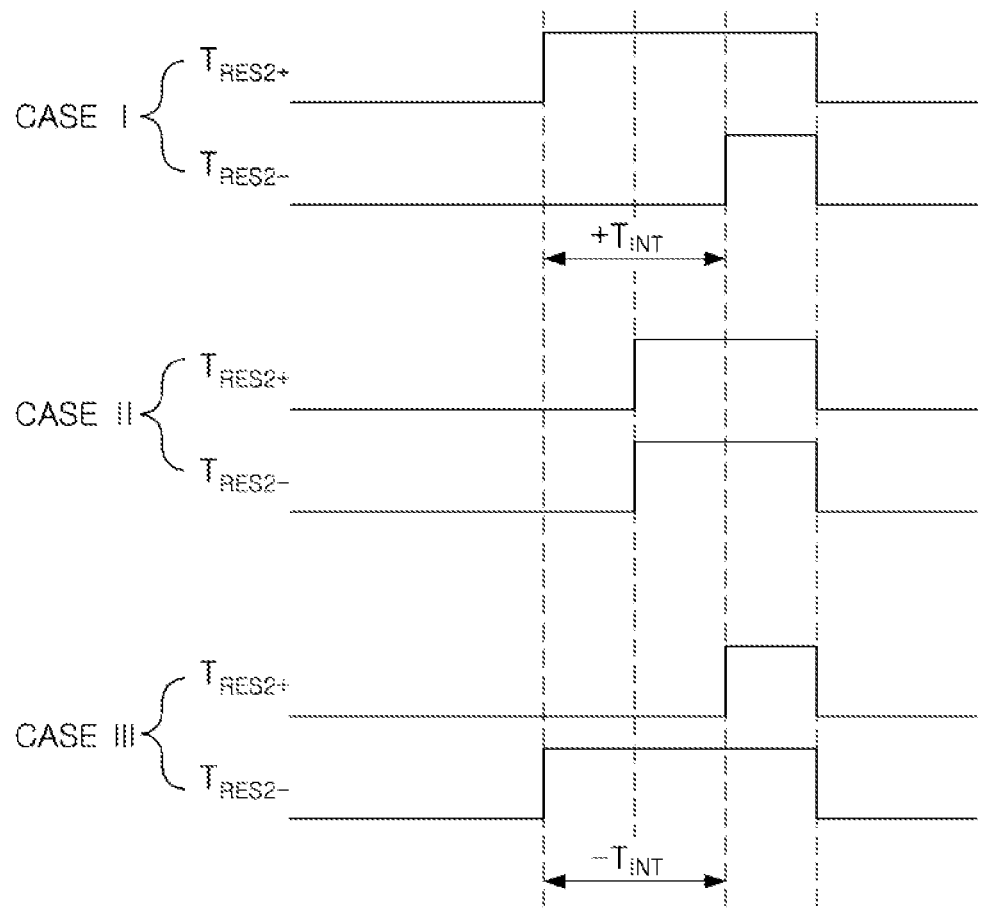
FIG. 10 is a graphical signal timing diagram illustrating a full-scale range of an ITC output according to an exemplary embodiment of the present inventive concept.

FIG. 10 illustrates a full-scale range of an ITC output according to an exemplary embodiment of the present inventive concept.

Referring to FIG. 10, when the first residual current ($I_{RES2+}$) is 0.7 µA, and the second residual current ($I_{RES2-}$) is 0.3 µA (CASE I), an ITC output ($T_{RES2}$), which is a time between a point in time at which the first residual time signal ($T_{RES2+}$) rises and the second residual time signal ($T_{RES2-}$) rises, may be $+T_{INT}$.

When the first residual current ($I_{RES2+}$), and the second residual current ($I_{RES2-}$) is 0.5 µA, respectively (CASE II), an ITC output ($T_{RES2}$), which is a time between a point in time at which the first residual time signal ($T_{RES2+}$) rises and the second residual time signal ($T_{RES2-}$) rises, may be 0.

When the first residual current ($I_{RES2+}$) is 0.3 µA, and the second residual current ($I_{RES2-}$) is 0.7 µA (CASE III), an ITC output ($T_{RES2}$), which is a time between a point in time at which the first residual current ($I_{RES2+}$) rises and a point in time at which the second residual current ($I_{RES2}$) rises, may be $-T_{INT}$.

Therefore, the full-scale range of the ITC output ($T_{RES2}$) may be $\pm T_{INT}$.

Figure 11:
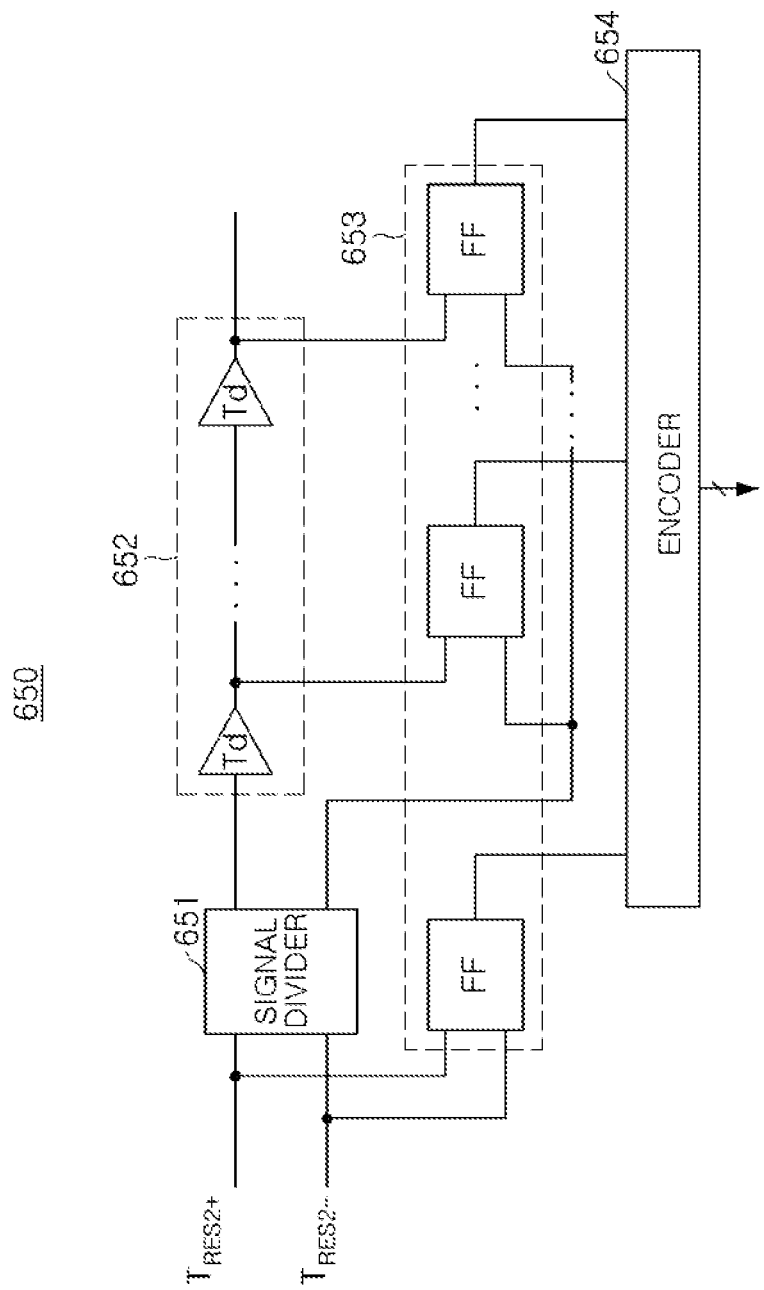
FIG. 11 is a schematic block diagram illustrating a TDC according to an exemplary embodiment of the present inventive concept.

FIG. 11 shows a TDC according to an exemplary embodiment of the present inventive concept.

Referring to FIG. 11, a TDC 650 may include a signal divider 651, a delay cell group 652, a flip-flop group 653, and an encoder 654. The signal divider 651 may receive a first residual time signal ($T_{RES2+}$) and a second residual time signal ($T_{RES2-}$) from the ITC. The signal divider 651 may determine which of the first residual time signal ($T_{RES2+}$) and the second residual time signal ($T_{RES2-}$) is input, first. That is, the signal divider 651 can know which, of a time when the first residual time signal ($T_{RES2+}$) rises and the time when the second residual time signal ($T_{RES2-}$) rises, occurs first. For example, the first residual time signal ($T_{RES2+}$) may be input before the second residual time signal ($T_{RES2-}$).

The delay cell group 652 may include a plurality of delay cells, each having a delay time Td. The delay cell group 652 may output a delayed residual time by delaying the first residual time signal ($T_{RES2+}$), which is input first, for the delay time Td. The delay cell group 652 may output a delayed residual time by sequentially delaying the first residual time signal ($T_{RES2+}$), which is input first, by using a plurality of delay cells for the delay time Td.

The flip-flop group 653 may include a plurality of flip-flops. One of the plurality of flip-flops may receive a delayed first residual time signal ($T_{RES2+}$) and a second residual time signal ($T_{RES2-}$). The flip-flop group 653 may compare the delayed first residual time signal ($T_{RES2+}$) and the second residual time signal ($T_{RES2-}$), and output a result of the comparison.

Each of the plurality of flip-flops among the plurality of flip-flops, except for the first flip-flop which receives undelayed signals, may be connected to each of the plurality of delay cells in the delay cell group 652. For example, each of the plurality of flip-flops may receive the delayed residual time and the second residual time signal ($T_{RES2-}$).

Specifically, the delay cell group 652 may delay the first residual time signal ($T_{RES2+}$) of the first time information ($T_{RES2}$), which is input first, by the delay time Td, and output a primary delayed residual time. The flip-flop group 653 may compare the primary delayed residual time and the second residual time signal ($T_{RES2-}$), and output a result of the comparison.

The delay cell group 652 may delay the primary delayed residual time by the delay time Td and output a secondary delayed residual time. The flip-flop group 653 may compare the secondary delayed residual time and the second residual time signal ($T_{RES2-}$), and output a result of the comparison.

When the delay cell group 652 includes 15 delay cells and the flip-flop group 653 includes 16 flip-flops, the delay cell group 652 and the flip-flop group 653 can perform the above-described delay operation 15 times and the flip-flop operation 16 times.

The encoder 654 may output digital signals by combining output signals of a plurality of flip-flops included in the flip-flop group 653.

For example, when the delay cell group 652 includes 15 delay cells, a full-scale range of the TDC may be ±16 Td, and may output a 5-bit digital signal.

According to an exemplary embodiment of the present inventive concept, a full-scale range of an ITC output and a full-scale range of a TDC may be matched. To match the full-scale range of the ITC output with the full-scale range of the TDC, a turn-on time of an ITC's sampling clock can be generated using delay cells included in the TDC. That is, the turn-on time signal ($T_{INT}$) of the sampling clock signal ($\Phi_{TS}$) in FIG. 9 may be generated using delay cells included in the TDC.

Figure 12:
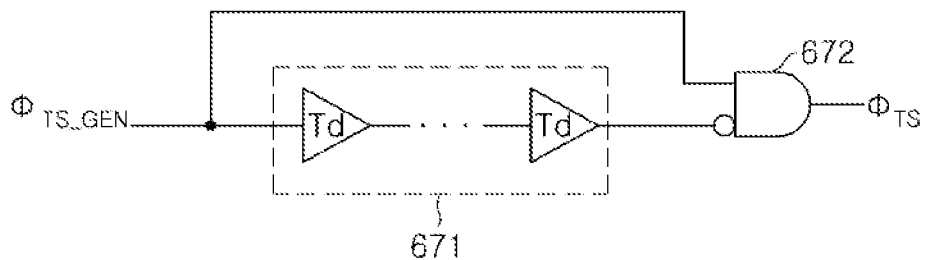
FIG. 12 is a schematic circuit diagram illustrating a clock signal generator according to an exemplary embodiment of the present inventive concept.
Figure 13:
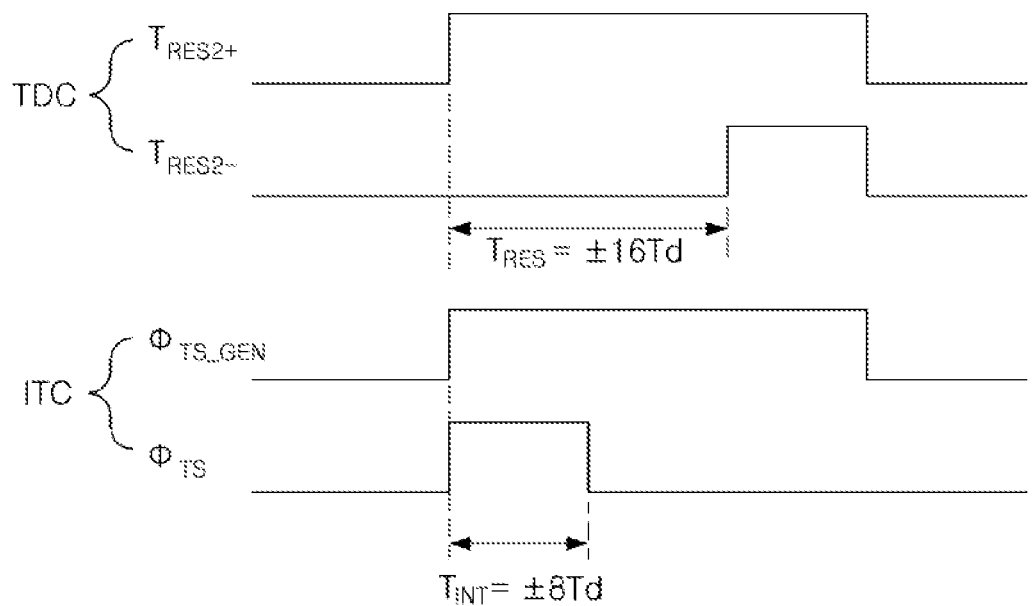
FIG. 13 is a graphical signal timing diagram illustrating an operation of the clock signal generator of FIG. 12.

FIG. 12 illustrates a clock signal generator according to an exemplary embodiment of the present inventive concept, and FIG. 13 illustrates an operation of the clock signal generator according to an exemplary embodiment of the present inventive concept. A clock signal generator 670 of FIG. 12 may generate clocks used in a voltage-current-time domain pipeline ADC 600 of FIG. 7.

Referring to FIG. 12, the clock signal generator 670 may include delay cells 671 and a logic operator 672. The delay cells 671 may include replicas formed identically to at least a portion of the delay cells included in a TDC. The logic operator 172 may be an AND with inverted delay input. Alternatively, the logic operator 172 may be an OR with inverted non-delay input and inverted or complimentary signal output.

Referring to FIGS. 11 to 13, the delay cells 671 may generate a delayed clock signal by delaying an arbitrary clock signal ($\Phi_{TS\_GEN}$). The logic operator 672 may receive an arbitrary clock signal ($\Phi_{TS\_GEN}$) and the delayed clock signal. The logic operator 672 may output a sampling clock signal ($\Phi_{TS}$) having a pulse width corresponding to the delay time of the delay cells 671. For example, when the delay cells 671 include 8 delay cells, and the delay time of each delay cell is Td, a pulse width ($T_{INT}$) of the sampling clock signal ($\Phi_{TS}$) may be 8*Td.

When the delay cell 652 includes 15 delay cells, a full-scale range of the TDC may be ±16 Td, and a full-scale range of an ITC output may be ±8*Td. In this case, when a redundancy bit of the analog-to-digital converter is 1 bit, the TDC can output a 5-bit digital signal.

According to an exemplary embodiment of the present inventive concept, even if a change by PVT occurs in the delay cell 652 determining the full-scale of the TDC, the full-scale range of the ITC output is defined as a sampling clock signal ($\Phi_{TS}$) implemented as a replica of the delay cell 652 of the TDC and changes to the same scale as the full-scale of the TDC. Therefore, the full-scale range of the ITC output and the full-scale range of the TDC can be matched. Thus, the ADC may be less burdened with complex calibration techniques or PVT variations.

As set forth above, according to an exemplary embodiment of the present inventive concept, by adding a time domain time digital converter as a rear stage of a voltage-current domain pipeline SAR ADC, it is possible to minimize power consumption of the ADC while maintaining high resolution and/or high-speed operation.

In addition, by matching a full-scale range of the current-time converter output to a full-scale range of the time-to-digital converter in the voltage-current-time domain pipeline ADC, a burden on a complex calibration technique for current-time reference matching may be reduced.

Various embodiments and effects of the present inventive concept are not limited to the above description. For example, the particular order of the voltage domain stage, the current domain stage, and/or the time domain stage of a dual-stage or multi-stage ADC may be varied. Moreover, a frequency domain stage may be used in addition to or in lieu of any of the described stages, such as by applying a Laplace transform, a Fourier transform, or the like to one or more of the exemplary embodiments described herein.

While exemplary embodiments have been shown and described above, it will be apparent to those of ordinary skill in the pertinent art that modifications and variations may be made without departing from the scope of the present disclosure as defined by the appended claims.

What is claimed is:

1. An analog-to-digital converter (ADC), comprising:
a successive approximation register (SAR) ADC receiving an analog input voltage, generating a first digital signal from the analog input voltage using a SAR method, and outputting a residual output current remaining after generating the first digital signal;
a current-time converter converting the residual output current into a residual input time in a time domain; and
a time-digital converter receiving the residual input time, and generating a second digital signal from the residual input time,
wherein the first digital signal and the second digital signal are sequences of digital codes representing respective signal levels of the analog input voltage.

2. The ADC of claim 1, the SAR ADC including:
a coarse stage generating an M-bit digital signal from the analog input voltage, wherein M is a natural number greater than or equal to 1, and outputting a residual output voltage remaining after generating the M-bit digital signal, an amplifier converting the residual output voltage into a residual input current in a current domain, a fine stage generating an N-bit digital signal from the residual input current, wherein N is a natural number greater than or equal to 1, and outputting the residual output current remaining after generating the N-bit digital signal, wherein the current-time converter converts the residual output current into the residual input time, and wherein the M-bit digital signal and the N-bit digital signal are included in the first digital signal.

3. The ADC of claim 2, wherein the current-time converter comprises:

a capacitor charged with the residual output current during a turn-on time of a sampling clock;

a current source supplying a discharge current for discharging the capacitor charged with the residual output current; and a comparator comparing a voltage of a node between the capacitor and the current source with a reference voltage, and outputting a point in time at which the voltage of the node reaches the reference voltage as the residual input time.

4. The ADC of claim 3, wherein a magnitude of the discharge current is full-scale of the residual output current.

5. The ADC of claim 3, wherein a full-scale range of the residual input time, which is an output of the current-time converter, is determined by the turn-on time of the sampling clock.

6. The ADC of claim 3, wherein:

the residual input time comprises a first residual time and a second residual time, the time-digital converter comprises a delay cell group including a plurality of delay cells each having a delay time and outputting a delayed residual time by delaying the first residual time by the delay time, and a flip-flop group comparing the delayed residual time and the second residual time and outputting a result of the comparison, wherein the turn-on time of the sampling clock is a delay time of delay cells of at least a portion of the plurality of delay cells included in the time-digital converter.

7. The ADC of claim 1, wherein:

a full-scale range of the residual input time, which is an output of the current-time converter, matches a full-scale range of the time-digital converter.

8. The ADC of claim 7, wherein the voltage-digital converter using the SAR method comprises:

a coarse stage generating an M-bit digital signal from the analog input voltage, and outputting the residual output voltage remaining after generating the M-bit digital signal;

an amplifier converting the residual output voltage into a first residual current in a current domain; and a fine stage generating an N-bit digital signal from the first residual current, and outputting a second residual current remaining after generating the N-bit digital signal, wherein the time-digital converter converts the second residual current into the residual input time, and wherein the M-bit digital signal and the N-bit digital signal are included in the first digital signal.

9. The ADC of claim 8, wherein the amplifier comprises:

a first resistor for converting the residual output voltage into the first residual current; and a switch current mirror for sampling the first residual current.

10. The ADC of claim 9, wherein the fine stage comprises:

a current digital-to-analog converter (DAC) for receiving the first residual current and a reference current, and generating a differential voltage corresponding to a difference between the first residual current and the reference current using a second resistor;

a comparator comparing the differential voltage, and outputting a comparison result; and SAR logic generating the N-bit digital signal based on the comparison result.

11. The ADC of claim 7, wherein:

the ADC further comprises digital calibration logic receiving the first digital signal and the second digital signal, when the first digital signal has an (M+N)-bit length, the second digital signal has an L-bit length, the ADC has a 2-bit redundancy, and the digital calibration logic outputs an (M+N+L−2)-bit length digital signal.

12. An analog-to-digital converter (ADC), comprising:

a converter receiving an analog input signal in a first period, generating a digital signal from the analog input signal using a successive approximation register (SAR) method, and outputting a first residual current and a second residual current remaining after generating the digital signal;

a first capacitor charged with the first residual current during a turn-on time of a sampling clock in a second period after the first period;

a second capacitor charged with the second residual current during the turn-on time of the sampling clock in the second period;

a first current source supplying a first discharge current for discharging the first capacitor;

a second current source through which a second discharge current flows for discharging the second capacitor;

a first comparator, wherein the first capacitor is discharged with the first discharge current in a third period after the second period, the first comparator comparing a voltage of a first node between the first capacitor and the first current source with a reference voltage, and outputting a point in time at which the voltage of the first node reaches the reference voltage as a first residual time; and a second comparator, wherein the second capacitor is discharged with the second discharge current in the third period, the second comparator comparing a voltage of a second node between the second capacitor and the second current source with the reference voltage, and outputting a point in time at which the voltage of the second node reaches the reference voltage as a second residual time, wherein the digital signal is a portion of sequences of digital codes representing respective signal levels of the analog input signal.

13. The ADC of claim 12, wherein the voltage of the first node and the voltage of the second node in the second period decrease with slopes corresponding to magnitudes of the first residual current and the second residual current, respectively.

14. The ADC of claim 13, wherein in the third period, the voltage of the first node and the voltage of the second node decrease with the same slope.

15. The ADC of claim 13, wherein an interval between the first residual time and the second residual time is determined by the turn-on time of the sampling clock.

16. The ADC of claim 13, wherein the first residual time and the second residual time are maintained until both the first residual time and the second residual time reach the reference voltage.

17. An analog-to-digital converter (ADC), comprising:
a voltage-time converter comprising a current-time converter converting a residual output current remaining after generating a first digital signal from an analog input voltage using a successive approximation register (SAR) method into a residual input time in a time domain; and
a time-digital converter receiving the residual input time, and generating a second digital signal from the residual input time,
wherein the current-time converter comprises:
  a capacitor charged with the residual output current during a turn-on time of a sampling clock;
  a current source supplying a discharge current for discharging the capacitor; and
  a comparator comparing a voltage of a node between the capacitor discharged with the discharge current and the current source with a reference voltage, and outputting a point in time at which the voltage of the node reaches the reference voltage as the residual input time,
wherein the first digital signal and the second digital signal are sequences of digital codes representing respective signal levels of the analog input voltage.

18. The ADC of claim 17, wherein a full-scale range of the residual input time, which is an output of the current-time converter, matches a full-scale range of the time-digital converter.

19. The ADC of claim 17, wherein the time-digital converter comprises:
a delay cell group including a plurality of delay cells, each having a delay time; and
a flip flop group including a plurality of flip flops, at least a portion of the plurality of flip flops being connected to each of the plurality of delay cells,
wherein the turn-on time of the sampling clock is a delay time of at least a portion of the plurality of delay cells included in the time-digital converter.

20. The ADC of claim 19, wherein:
the ADC further comprises a clock signal generator generating the sampling clock,
the clock signal generator comprises a replica formed identically to at least a portion of the plurality of delay cells included in the time-digital converter.

* * * * *